United States Patent
Jameson, III (10) Patent No.: US 9,165,648 B1
(45) Date of Patent: Oct. 20, 2015

(54) RESISTIVE MEMORY DEVICES, CIRCUITS AND METHODS HAVING READ CURRENT LIMITING

(75) Inventor: John Ross Jameson, III, Burlingame, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 96 days.

(21) Appl. No.: 13/336,642

(22) Filed: Dec. 23, 2011

(51) Int. Cl.
*G11C 17/00* (2006.01)
*G11C 13/00* (2006.01)

(52) U.S. Cl.
CPC ........ *G11C 13/0069* (2013.01); *G11C 13/0007* (2013.01)

(58) Field of Classification Search
CPC .................. G11C 13/0069; G11C 13/0004
USPC .................... 365/148, 100, 163, 171
See application file for complete search history.

(56) References Cited

U.S. PATENT DOCUMENTS

| | | | |
|---|---|---|---|
| 5,761,115 A | 6/1998 | Kozicki et al. | |
| 6,487,106 B1 | 11/2002 | Kozicki | |
| 6,635,914 B2 | 10/2003 | Kozicki et al. | |
| 7,126,152 B2 | 10/2006 | Ishida et al. | |
| 7,233,515 B2 * | 6/2007 | Rohr | 365/148 |
| 7,239,542 B2 | 7/2007 | Ootsuka et al. | |
| 7,242,606 B2 * | 7/2007 | Hachino et al. | 365/148 |
| 7,292,466 B2 | 11/2007 | Nirschl | |
| 7,359,236 B2 | 4/2008 | Gilbert | |
| 7,372,718 B2 | 5/2008 | Nagao et al. | |
| 7,411,854 B2 | 8/2008 | Klostermann et al. | |
| 7,423,906 B2 | 9/2008 | Symanczyk | |
| 7,428,163 B2 | 9/2008 | Hoenigschmid et al. | |
| 7,457,145 B2 | 11/2008 | Kund et al. | |
| 7,471,543 B2 | 12/2008 | Nakashima et al. | |
| 7,514,706 B2 | 4/2009 | Gilbert | |
| 7,534,713 B2 * | 5/2009 | Lung | 438/600 |
| 8,027,206 B2 * | 9/2011 | Yoon et al. | 365/189.06 |
| 8,441,839 B2 * | 5/2013 | Azuma et al. | 365/148 |
| 8,451,645 B2 * | 5/2013 | Yoon et al. | 365/148 |
| 8,885,387 B2 * | 11/2014 | Azuma et al. | 365/148 |
| 2006/0092685 A1 * | 5/2006 | Ootsuka et al. | 365/145 |
| 2006/0139989 A1 | 6/2006 | Gruning Von Schwerin et al. | |

\* cited by examiner

*Primary Examiner* — Connie Yoha (57) ABSTRACT

A memory device, comprising: read circuits coupled to a plurality of memory elements programmable between at least two different resistance states, the read circuits generating output values based on resistance states of selected memory elements in a read operation; and current limit circuits that limit a current flow through each memory element to less than a program threshold current; wherein the program threshold current corresponds to a current that flows through a memory element being programmed to cause its resistance to change to a resistance between that of two different resistance states.

36 Claims, 10 Drawing Sheets

FIG. 15 (BACKGROUND)

RESISTIVE MEMORY DEVICES, CIRCUITS AND METHODS HAVING READ CURRENT LIMITING

TECHNICAL FIELD

The present disclosure relates generally to memory devices, and more particularly to resistive memory devices having memory elements that can be programmed between different resistance states.

BACKGROUND

Conventional resistive memory devices can store data values by programming resistive memory elements between two different resistance states: a high resistance (Roff) and a low resistance (Ron). A memory element can be programmed from a high resistance to a low resistance by applying electrical conditions that create a programming voltage across the memory element, resulting in a programming current flowing through the memory element.

Figure 15:
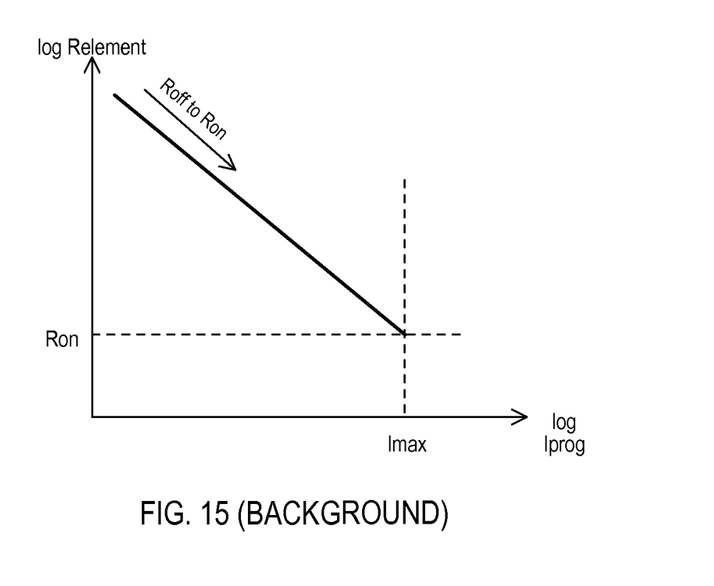
FIG. 15 is a graph showing a convention programming operation for a resistance element.

A conventional resistive element programming operation is shown in FIG. 15. FIG. 15 is a graph showing an element resistance (Relement) (on a logarithmic scale) versus a programming current (Iprog) (on a logarithmic scale) in a programming operation. The programming operation programs an element from a high resistance state to a low resistance state (shown by "Roff to Ron").

In the conventional programming operation shown, a low resistance state (Ron) can correspond to a maximum current (Imax) allowed to flow through a memory element in the programming operation.

Conventionally, data values stored in resistive memory elements are determined with read operations. In a conventional read operation, a resistance of the memory elements is sensed. Typically, electrical conditions can be applied that cause a read current to flow through the memory elements being read.

A known problem with conventional resistive memory devices is "read disturb". A read disturb occurs when a read operation (or number of read operations) cause a memory element that was in a high resistance state to unexpectedly change to a low resistance state, thus creating an erroneous data value.

BRIEF DESCRIPTION OF THE DRAWINGS

FIGS. 3A to 3B-2 are diagrams showing memory elements that can be included in embodiments.

FIG. 10A to 10D-1 are diagrams showing current limiting circuits that can be included in embodiments.

DETAILED DESCRIPTION

Embodiments described herein show memory devices, circuits and methods for reading data from programmable resistance (resistive) memory elements that can reduce read disturbs. Unlike conventional approaches, in a read operation, a read current through a memory element can be limited, based on a programming response for such memory elements.

In the various embodiments shown below, like items are referred to with the same reference character but with the first digit(s) corresponding to the figure number.

Figure 1A:
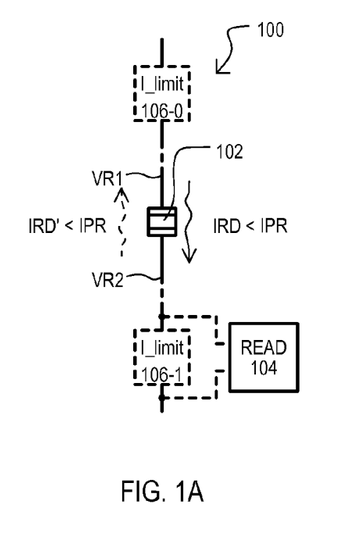
FIGS. 1A to 1D are a series of diagrams showing a memory device according to an embodiment.

Referring now to FIG. 1A to 1D, a memory device and method are shown in a series of diagrams. FIG. 1A shows a memory device 100 according to an embodiment. A memory device 100 can include a memory element 102, a read circuit 104, and one or both of current limit circuits 106-0/1. A memory element 102 can be a two terminal element programmable between different resistance states. In the embodiment shown, a memory element 102 can be programmable between at least two resistance states R0 and R1, where R1 is a lower resistance than R0.

A read circuit 104 can sense a resistance of memory element 102 to thereby read a data value stored by the memory element 102. A read circuit 104 can sense a voltage and/or a current in determining a read data value. Accordingly, it is understood that a read circuit 104 can be situated in series to, or in parallel with, a current path through memory element 102. As indicated by the dashed connections, in some embodiments, a read circuit 104 can be situated between memory element 102 and current limit circuit 106-1. However, in alternate embodiments, a current limit circuit 106-1 can be situated between a read circuit 104 and an accessed memory element 102.

Current limit circuits 106-0/1 can limit a current flow through a memory element 102 in a read operation. Such a limit to a read current can be based on a program threshold current (IPR). A program threshold current (IPR) will be described in more detail below. A memory device 100 can include current limit circuit 106-0, current limit circuit 106-1, or both (106-0/1). It is understood that in some embodiments a current limit circuit 106-0/1 can include active circuit elements (e.g., transistors). However, in addition, or alternatively, a current limit circuit 106-0/1 can be formed from passive elements, or physical structures inherent in the memory devices (e.g., interconnects, substrate connections, etc.).

In a read operation, a read bias voltage (VR1-VR2) can be created across memory element 102 by operation of bias circuits, which may or may not include any of current limit circuits 106-0/1 and/or read circuit 104. A read bias voltage (VR1-VR2) can result in a current flow IRD through memory element 102. However, due to current limit circuit(s) 106-0/1, a read current (IRD) through memory element 102 can be limited based on a program threshold current (IPR). In the particular embodiment shown, a read current (IRD) can be restricted to be less than (IPR).

As shown by the dashed current representation IRD', in some embodiments a read current can flow away from (as opposed into) a read circuit 104.

Figure 1B:
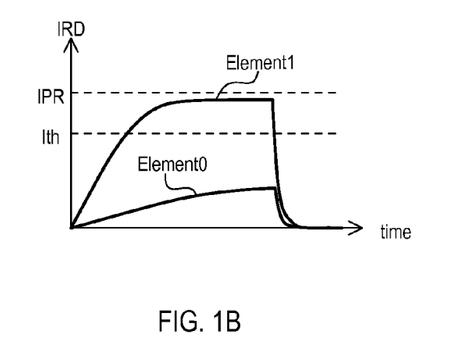

FIG. 1B is a graph showing one very particular read response according to an embodiment. FIG. 1B shows a read current (IRD) versus time in a read operation. Waveform "Element1" shows a response of a memory element programmed to one state (having a lower resistance R1). Waveform "Element0" shows a response of a memory element programmed to another state (having a higher resistance R0). In the very particular example shown, a current level Ith shows a threshold level used to determine a data value. That is, if a memory element draws a current greater than Ith, it can be determined to store one value (i.e., "1"). However, if a memory element draws a current less than Ith, it can be determined to store another value (i.e., "0"). In alternate embodiments, a read data value can be determined based on a voltage generated in response to a memory element resistance.

As shown in FIG. 1B, in the lower resistance case (Element1), a read current (IRD) through a memory element 102 can be restricted to less than IPR.

Figure 1C:
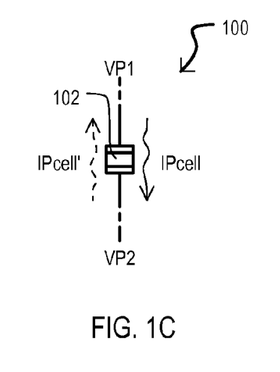
Figure 1D:
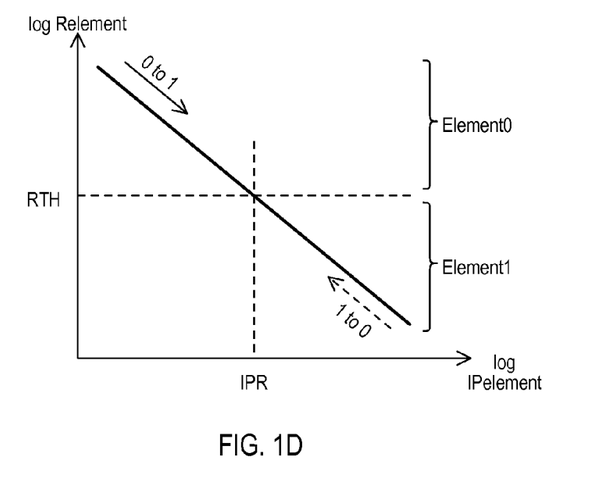

Referring now to FIGS. 1C and 1D, derivation of a program threshold current (IPR) used to limit a read current (IRD), according to one embodiment, will now be described. FIG. 1C shows memory element 102 in a program operation. A program operation can establish a resistance of a memory element 102 (and hence the data value stored by the memory element). A memory element 102 can be programmed between two or more resistance states. In some embodiments, memory element resistance states can be substantially non-volatile, retaining a programmed state over time. However, in alternate embodiments, memory element resistance states can be substantially volatile, with one or more resistance states drifting in the absence of another program, or program-like operation, that can reinforce the initially programmed state.

In a program operation, a program bias voltage (VP1-VP2) can be created across memory element 102 by operation of program bias circuits. In response to such a voltage, a resistance of memory element 102 can change from one value to another (e.g., from a higher resistance to a lower resistance, or from a lower resistance to a higher resistance). During such a programming operation, a program current (IPelement) can flow through a memory element 102.

FIG. 1D is a graph showing a derivation of a program threshold current (IPR). FIG. 1D shows a memory element resistance (Relement), on a logarithmic scale, versus a memory element program current (IPelement), also on a logarithmic scale. In FIG. 1D, a threshold resistance Rth can be a resistance that delineates two different programmed resistance states. That is, if Relement>Rth, a memory element 102 can store one data value (Element0). In contrast, if Relement<Rth, a memory element 102 can store another data value (Element1). As shown in FIG. 1D, a program threshold current (IPR) can be a current that flows through a memory element 102 during a program operation to cause the resistance of the memory element 102 to change to a resistance of (or about) Rth.

In some embodiments, a program threshold current (IPR) can be derived based on a memory element 102 being programmed from a higher resistance to a lower resistance (shown by direction "0 to 1"). However, in other embodiments, a program threshold current (IPR) can be derived based on a memory element 102 being programmed from a lower resistance to a higher resistance (shown by direction "1 to 0"). Still further, a value IPR can be derived from based on a memory element being programmed in both directions (i.e., from 0 to 1 and 1 to 0).

Referring back to FIG. 1C, from the above description, it is understood that current limit circuits 106-0/1 are bypassed and/or disabled in program operation, allowing a current through memory element 102 to reach (and possible exceed IPR).

It is understood that while some embodiments may limit a read current (IRD) to less than a program threshold current (IPR), some embodiments may do so with some margin (i.e., guardband), such that a read current can be limited to IPR less some additional guardband amount.

In this way, a memory device can limit current flowing through individual memory elements to less than a program threshold current, where a program threshold current corresponds to a current flowing through a memory element to cause its resistance to change to the threshold resistance during a program operation. A threshold resistance can be a resistance that delineates or is between two different programmable resistance states.

Figure 2:
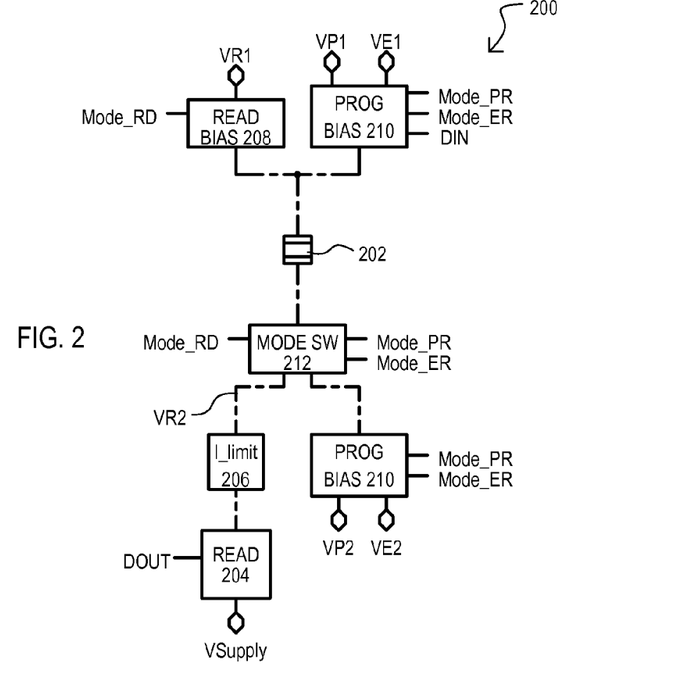
FIG. 2 is a block schematic diagram of a memory device according to another embodiment.

Referring now to FIG. 2, a memory device 200 according to another embodiment is shown in a block schematic diagram. In one embodiment, a memory device 200 can be one implementation of that shown in FIGS. 1A to 1D.

FIG. 2 shows a read bias circuit 208, a program bias circuit 210, a mode switch 212, current limit circuit 206, and read circuit 204. A read bias circuit 208 can apply a first read voltage VR1 to a memory element 202 in response to a mode signal Mode_RD. Similarly, a program bias circuit 210 can selectively apply programming voltages (VP1, VE1, VP2, VE2) to memory element 202 in response to mode signals Mode_PR, Mode_ER, and a write data signal DIN. More particularly, in a first program operation (i.e., program), if a DIN has one value, a program bias circuit 210 can apply voltages VP2 and VP1 across memory element 202, and if DIN has another value, a program bias circuit 210 can apply a lower, or no voltage across memory element (i.e., VP2 can be applied to both terminals of memory element 202). In the first program operation, a mode switch 212 can enable a conductive path between memory element 202 and program voltage VP2. Also in the first program operation, a read bias circuit 208, current limit circuit 206, and read circuit 204 can be isolated from memory element 202.

In a second program operation (i.e., erase) a program bias circuit 210 can apply voltages VE2 and VE1 across memory element 202. As in the first program operation (i.e., program), a mode switch 212 can enable a conductive path between memory element 202 and program voltage VE2, while read bias circuit 208, current limit circuit 206, and read circuit 204 can be isolated from memory element 202.

In a read operation, a read bias circuit 208 can apply a first read voltage VR1 to memory element 202. Mode switch 212 can enable a conductive path between memory element 202 and current limit circuit 206. By operation of current limit circuit 206 and/or read circuit 208, a voltage VR2 can be applied to memory element 202, such that V1-V2 is applied across the read element. In the read operation, current limit circuit 206 can limit a read current through memory element 202 according to a program threshold current (IPR), as described herein, and equivalents. Based on a sensed resistance of memory element 202, read circuit 204 can output a data value DOUT.

Memory elements as described herein can take various forms. However, in some embodiments memory elements can be two terminal elements having a programmable resistance material formed between two electrodes. In a particular embodiment, a memory element can include a solid ion conductor material formed between an anode electrode and a cathode electrode. An anode electrode can include one or more metals that can ion conduct within the solid ion conductor material. A cathode electrode can include one or more conductive materials that do not ion conduct within the solid ion conductor.

In particular embodiments, a programmable resistance material can include a chalcogenide. In a very particular embodiment, a chalcogenide can include germanium and sulfur. Further, an ion conducting metal can include silver and/or copper. In addition or alternatively, a programmable resistance material can include a transition metal oxide (including a rare earth element oxide).

Figure 3A:
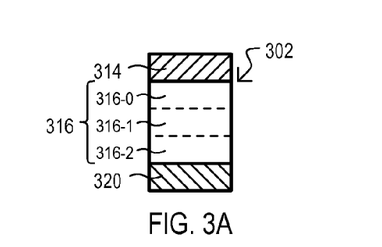

FIGS. 3A to 3B-2 show particular memory elements that can be included in embodiments. Referring to FIG. 3A, a memory element 302 can include a memory material 316 formed between a first electrode 314 and a second electrode 320. In some embodiments, a memory material 316 can be one layer. However, in alternate embodiments, a memory material 316 can include multiple layers, including insulating layers, or layers having different concentrations of one or more elements. In the very particular embodiment shown, a memory material 302 can include three layers 316-0 to -2.

FIG. 3A shows a memory element 302 in an erased state. In an erased state, a memory material 316 can have a relatively high resistance.

Figure 3B:
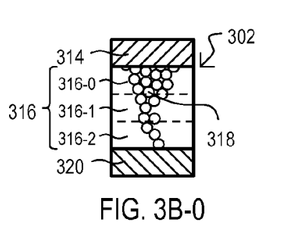

FIG. 3B-0 shows a memory element 302 in a first programmed state. In response to program electrical conditions, conductive filament(s) 318 can be formed within memory material 316 that can provide a conductive path between electrodes 314 and 320, resulting in a substantial decrease in resistance. In response to erase electrical conditions that establish an electric field opposite to that of the program electrical conditions, a memory element 302 can be returned to the erased state.

Figure 3B:
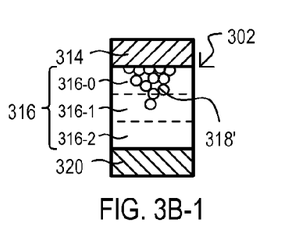

FIG. 3B-1 shows a memory element 302 in a second programmed state. In response to program electrical conditions, a conductive filament(s) 318' can be formed having some local increase in density, but may not span electrodes 314 and 320. As in the case of FIG. 3B-0, application of opposing erase conditions can return memory element 302 to the erased state.

Figure 3B:
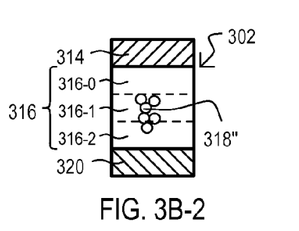

FIG. 3B-2 shows a memory element 302 in a third programmed state. In response to program electrical conditions, a conductive elements can accumulate within a localized region of memory material 316 to create conductive accumulation 318". Application of opposing erase conditions can return memory element 302 to the erased state.

Memory devices according to embodiments can include various memory cell types, where such memory cells incorporate one or more memory elements. Very particular architectures that provide read current limiting to memory cells will now be described.

Figure 4:
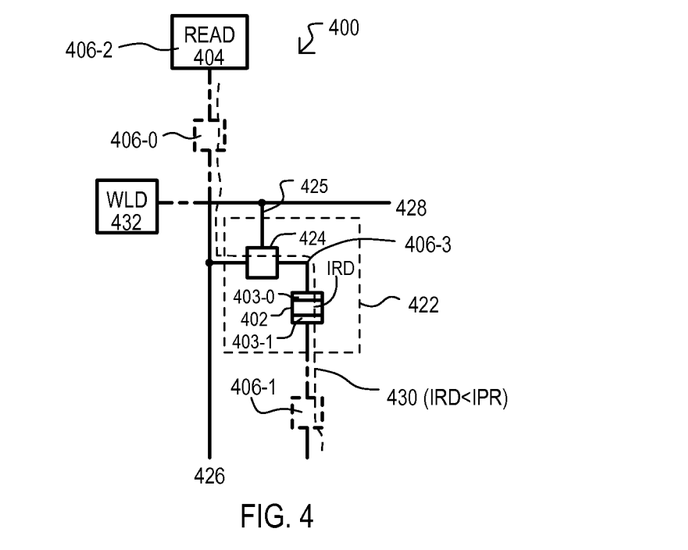
FIG. 4 is a block schematic diagram of a memory device having memory cells with access devices, according to an embodiment.

FIG. 4 is a block schematic diagram of a memory device 400 according to an embodiment. A memory device 400 can include memory cells (one shown as 422) that each includes a memory element 402 and an access device 424. An access device 424 can provide a controllable current path between a bit line 426 and a first terminal 403-0 of memory element 402. A current path of access device 424 can be controlled by conditions applied to a control terminal 425. In the embodiment shown, a control terminal 425 can be connected to word line 428, which can be controlled via a word line driver 432. In particular embodiments, a word line 428 can be connected to access devices of multiple memory cells of a same row.

In the embodiment shown, a current limit circuit 406-0 and read circuit 404 can be connected, directly or indirectly, to bit line 426. In addition or alternatively, a current limit circuit 406-1 can be connected, directly or indirectly, to a second terminal 403-1 of memory element 402. Still further, all or a portion of a current limit circuit can exist within read circuit 404 (shown as 406-2). In addition or alternatively, all or a portion of a current limit circuit can be formed by structures inherent to the circuit, such as the interconnect between access device 424 and the memory element 402 (shown as 406-3).

FIG. 4 shows a read current path 430 in a read operation. In a read operation, access device 424 can be enabled, allowing a current path between bit line 426 and memory element 402. By operation of current limit circuit 406-0 and/or 406-1, a current through the read current path 430 can be limited to less than a program threshold current (IRD<IPR), as described herein, and equivalents.

Figure 5:
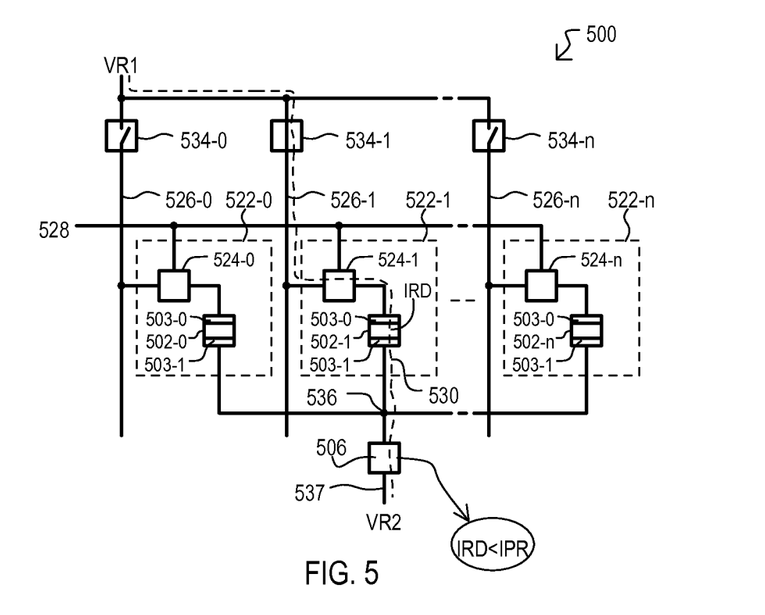
FIG. 5 is a block schematic diagram of a memory device having memory cells with access devices, according to another embodiment.

FIG. 5 is a block schematic diagram of a memory device 500 according to another embodiment. In one particular embodiment, FIG. 5 can be one implementation of that shown in FIG. 4.

FIG. 5 differs from FIG. 4 in that it shows a row of memory cells 522-0 to -n. Memory elements (502-0 to -n) of memory cells of a same row can have second terminals 503-1 connected to a common node 536. A current limit circuit 506 can be connected between common node 536 and a bias node 537. Further, each bit line 526-0 to -n can be connected to a read voltage VR1 by a corresponding column select circuit 534-0 to -n.

FIG. 5 shows a read current path 530 in a read operation. In a read operation, all access devices 524-0 to -n can be enabled by operation of word line 528. However, only one of the column select circuits (in the example shown, 534-1) can be enabled (provide a conductive path). Accordingly, a read current path 530 can flow through the enabled column select circuit 534-1, the corresponding bit line 526-1, access device 524-1 and memory element 502-1. By operation of current limit circuit 506, a current through the read current path 530 can be limited to less than a program threshold current (IRD<IPR), as described herein, and equivalents.

Figure 6:
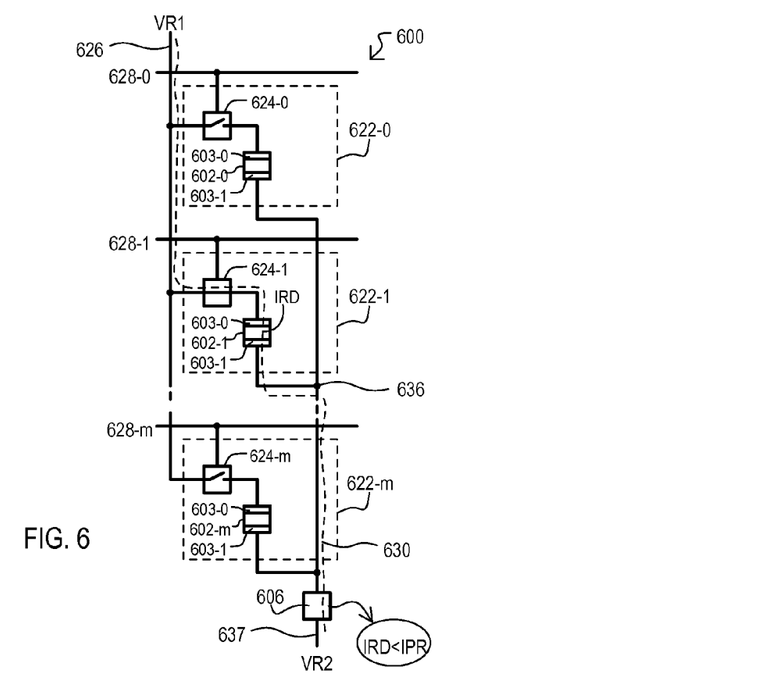
FIG. 6 is a block schematic diagram of a memory device having memory cells with access devices, according to a further embodiment.

FIG. 6 is a block schematic diagram of a memory device 600 according to a further embodiment. In one particular embodiment, FIG. 6 can be one implementation of that shown in FIG. 4.

FIG. 6 differs from FIG. 4 in that it shows a column of memory cells 622-0 to -m having a memory elements (602-0 to -m) with second terminals 603-1 connected to a common node 636. A current limit circuit 606 can be connected between common node 636 and a bias node 637. Each memory cell (622-0 to -m) can be connected to a different word line 628-0 to -m.

FIG. 6 shows a read current path 630 in a read operation. In a read operation, one of the word lines (in the example shown 628-1) can be placed in a select state (SEL), while the remaining word lines can be placed in a deselect state (DESEL). Consequently, access device 624-1 can be enabled, while the other access devices can be disabled (provide little or no current path). As a result, a read current path 630 can flow through bit line 626, the selected access device 624-1 and memory element 602-1. By operation of current limit circuit 606, a current through the read current path 630 can be limited to less than a program threshold current (IRD<IPR), as described herein, and equivalents.

Figure 7:
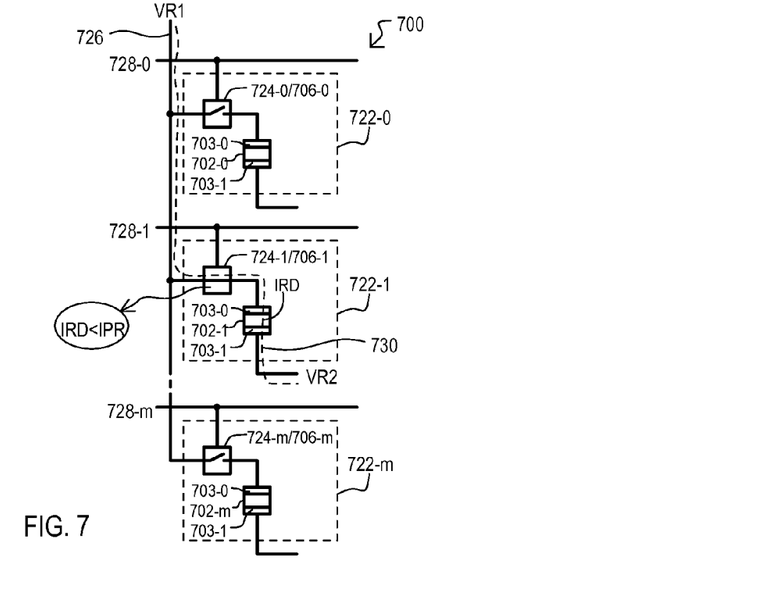
FIG. 7 is a block schematic diagram of a memory device having memory cells with access devices that can also serve as read current limiting circuits, according to an embodiment.

FIG. 7 is a block schematic diagram of a memory device 700 according to another embodiment. FIG. 7 shows an arrangement like that of FIG. 6, however, unlike FIG. 6 access devices are also current limit circuits (shown as 724-0/706-0 to 724-m/706-m).

FIG. 7 shows a read current path 730 in a read operation. In a read operation, one of the word lines (in the example shown 728-1) can be placed in a read state (READ), while the remaining word lines can be placed in a deselect state (DESEL). In response to a word line (e.g., 728-0, -m) being in the READ state, the corresponding access devices (e.g., 724-1/706-1) can allow current to flow through its respective memory element (e.g., 702-1), but such a read current can be limited to less than a program threshold current (IRD<IPR), as described herein, and equivalents.

It is noted that in other modes of operation, such as program modes of operation, word lines (728-0 to -m) can be driven to a SEL state. When a word line (728-0 to -m) is in a SEL state, corresponding access devices (724-0/706-0 to 724-n/706-n) can allow current to a memory element to exceed IPR.

While embodiments can include memory devices with memory cells having one or more access devices and one or more memory elements, other embodiments can include cross point type arrays, in which a memory cell can include a single element disposed between to conductive lines. Particular cross point type array embodiments will now be described.

Figure 8:
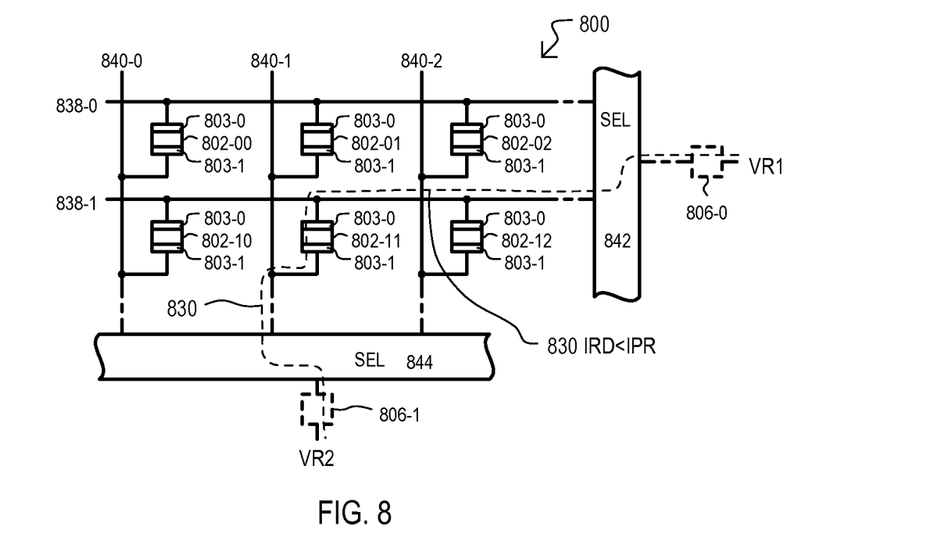
FIG. 8 is a block schematic diagram of a memory device having a cross point array, according to an embodiment.

FIG. 8 is a block schematic diagram of a memory device 800 according to an embodiment. A memory device 800 can include a number of memory elements (802-00 to -12), each connected between a first conductive line (e.g., one of 838-0/1) and a second conductive line (e.g., one of 840-0 to -2). A first selection circuit 842 can selectively connect one of first conductive lines (e.g., 838-0/1) to a first read voltage VR1. Similarly, a second selection circuit 844 can selectively connect one of second conductive lines (e.g., 840-0 to -2) to a second read voltage VR2. By operation of first and second selection circuits (842/844), a read voltage VR1-VR2 can be applied across one memory element (802-00 to -12).

FIG. 8 shows the selection of memory element 802-11, thus a read current path 830 can be formed through first selection circuit 842, first conductive line 838-1, memory element 802-11, second conductive line 840-1, and second selection circuit 844.

A current limit circuit 806-0 can limit a read current flowing through a first selection circuit 842 to less than a program threshold current. In addition, or alternatively, a current limit circuit 806-1 can limit current flowing through a second selection circuit 844 to less than a program threshold current.

Figure 9:
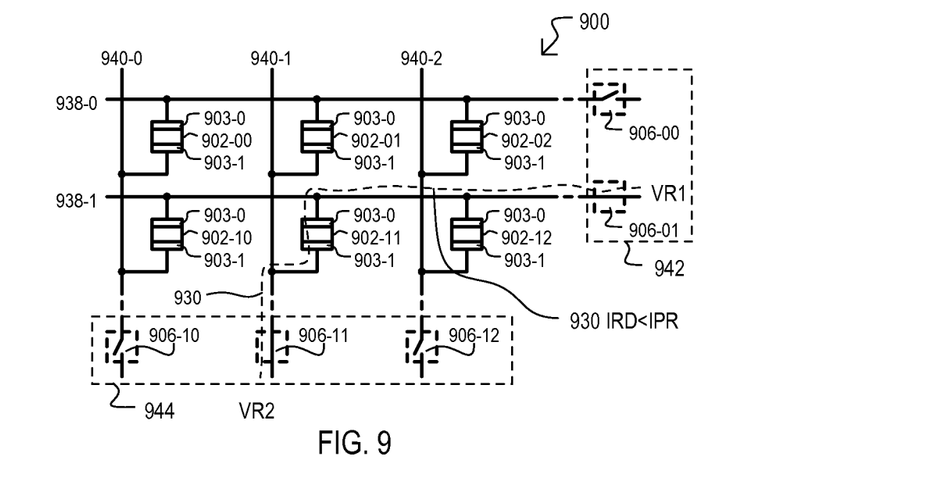
FIG. 9 is a block schematic diagram of a memory device having a cross point array, according to another embodiment.

FIG. 9 is a block schematic diagram of a memory device 900 according to another embodiment. A memory device 900 can have sections like that of FIG. 8. However, FIG. 9 differs from FIG. 8 in that selection circuit 942 and/or 944 can include current limit circuits 906-00 to -12, which can also serve as selection elements. In a read mode of operation, current limit circuits (906-00 to -12) can limit a current flowing through a selected memory element to less than a program threshold current.

In one embodiment, current limit circuits 906-00 to -12 can have alternate modes of operation (i.e., a program, erase) that can allow a current greater than a program threshold current to flow through a selected memory element.

According to embodiments herein, current limit circuits take any suitable form. Particular examples of current limit circuits that can be included in embodiments will now be described.

Figure 10A:
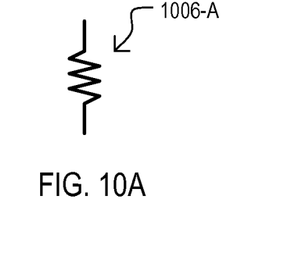

FIG. 10A shows a current limit circuit 1006-A that can be a resistance. A resistance 1006-A can be selected based on a read current path to ensure a current through memory element does not exceed a program threshold current.

Figure 10B:
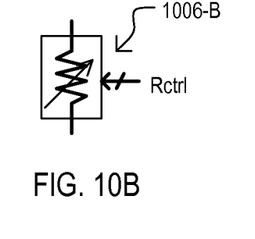

FIG. 10B shows a current limit circuit 1006-B that can be a variable resistance. A variable resistance 1006-B can be determined based on input values Rctrl. Values Rctrl can be selected based on a read current path to ensure a current through memory element does not exceed a program threshold current. In some embodiments, values Rctrl a substantially static, being established by values programmed in a memory device. However, in alternate embodiments, values Rctrl can be dynamic, varying according to mode of operation, as but one example.

Figure 10C:
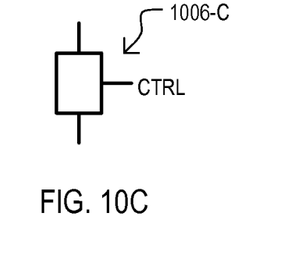

FIG. 10C shows a current limit circuit 1006-C that can be an active device. An active device 1006-C can be a three terminal device, with conditions applied at a control terminal CTRL affecting current flow through the other two terminals. In particular embodiments, active device 1006-C can include any suitable transistor, including insulated gate field effect (e.g., MOS) transistors, bipolar transistors, or junction field effect transistors, as but a few examples.

Figure 10D:
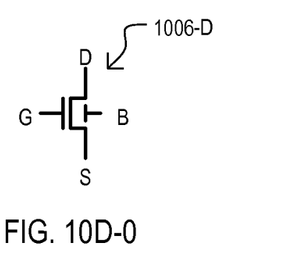
Figure 10D:
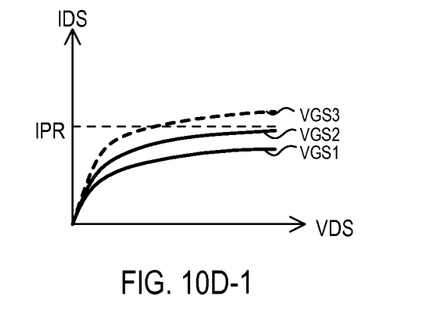

FIGS. 10D-0 shows a current limit circuit 1006-D as an n-channel MOS (NMOS) transistor. FIG. 10D-1 shows how bias conditions (i.e., VGS<VGS3) can limit a source-drain current to less than a program threshold current IPR. While FIG. 10D-1 shows biasing according to a gate-source voltage (VGS), any suitable biasing method can be used to arrive at current limiting, including body biasing. While FIGS. 10D-0/1 show an NMOS device, a PMOS device could also be used.

According to some embodiments, memory element responses (i.e., program threshold current) can vary for various reasons, including but not limited to: manufacturing process, operating voltage, and/or operating conditions, as but a few examples. Accordingly, memory devices can operate according to configuration data that can establish limits to a read current based on program threshold voltage (IPR).

An IPR limit can be a value derived from testing and/or simulation. In the former case, testing can be performed on a memory device at any of various stages of the manufacturing process. As but a few examples, an IPR value can be determined at a wafer probe stage (i.e., when memory devices are in die form). Such probing can occur on production dice or test structures between production dice. An IPR value can be determined on a packaged device with automatic test equipment (ATE). An ATE test device can program memory elements in a packaged device, and record an IPR value. Still further, a memory device can include built-in self-test (BIST) circuits that can program one or more memory elements to arrive at an IPR value for the device. According to some embodiments, memory devices from a same manufacturing lot can be sampled to arrive at an IPR value for the entire manufacturing lot.

Particular embodiments utilizing configuration values to set an IPR limit for a read current will now be described.

Figure 11A:
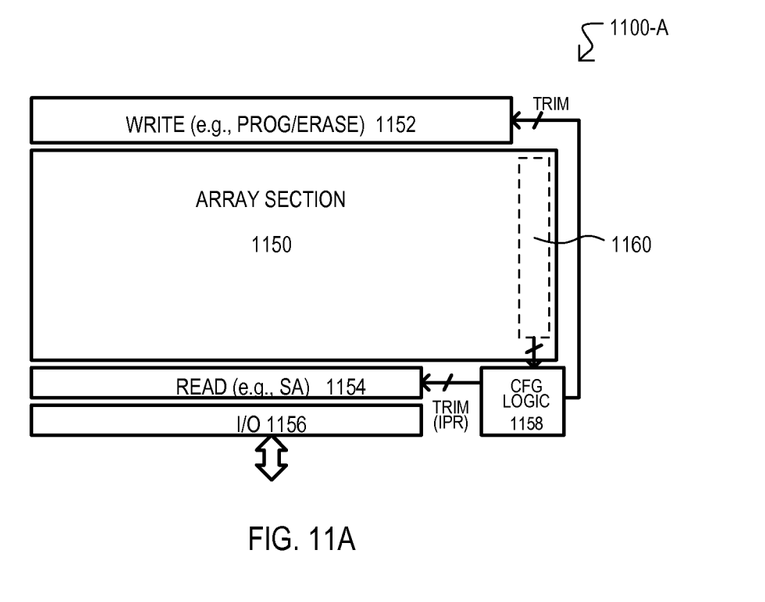
FIGS. 11A to 11C are block schematic diagrams showing memory devices according to various embodiments.

FIG. 11A shows a memory device 1100-A according to an embodiment. A memory device 1100-A can include a memory array section 1150, write circuits 1152, read circuits 1154, input/output (I/O) circuits 1156, and configuration logic 1158. A memory array section 1150 can include memory cells with programmable resistance elements as described herein, or equivalents.

Write circuits 1152 can apply voltages that can enable memory elements within memory array section 1150 to be programmed between two or more resistance states. In the embodiment shown, programming operations can be adjusted according to trim values TRIM. As but a few examples, programming voltage levels, programming times (e.g., pulse durations, pulse numbers), can be set with TRIM values.

Read circuits 1154 can read data values from memory cells within memory array section 1150 by applying electrical conditions that determine a resistance of accessed memory elements. In the embodiment shown, read operations can also adjusted according to trim values TRIM. Further, such TRIM values can include values that set an IPR limit to read currents.

I/O circuits 1156 can provide read and write data paths to access array section 1150.

In the particular embodiment shown, a memory array section 1150 can include a configuration data section 1160. A configuration data section 1160 can include any of: memory elements that are protected (e.g., protected from subsequent write operations) once they have been programmed; memory elements accessible only via security measures; or memory elements that are irreversibly programmed to particular resistance states (i.e., one-time programmable). In some embodiments, a configuration section 1160 can include memory elements like those that are accessed by write and read circuits (1152 and 1154). In alternate embodiments, a configuration section 1160 can include memory elements different from those used to store data in standard read and write operations.

Configuration logic 1158 can receive data values from configuration data section 1160, and in response, provide TRIM values to various sections of the memory device, including those that establish an IPR limit to a read current. In some embodiments, TRIM values can be provided to various sections of memory device 1100-A in power-on/reset type events.

Figure 11B:
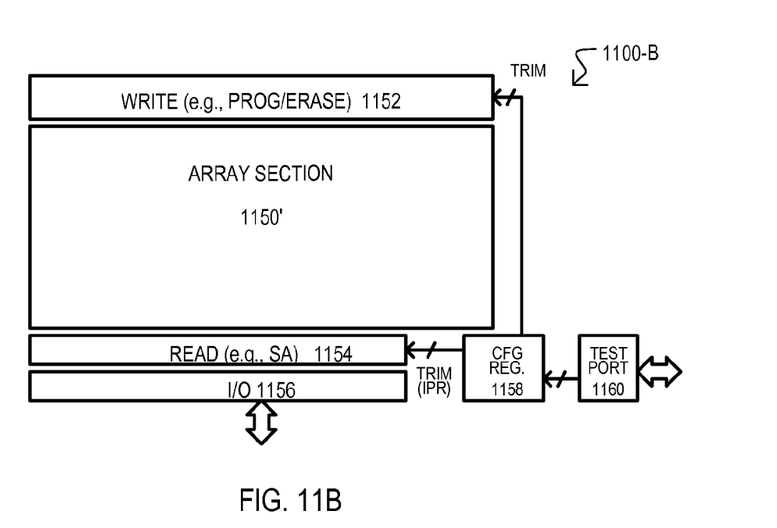

FIG. 11B shows a memory device 1100-B according to another embodiment. A memory device 1100-B can include sections like those of FIG. 11A. The embodiment of FIG. 11B differs from 11A in that TRIM values, including those that establish an IPR limit for read circuits 1154, can be provided by configuration registers 1158. Further, TRIM values within configuration registers 1158 can be entered into configuration registers via a test port 1160. A test port 1160 can be accessed by a testing device, such as automatic test equipment (ATE) or a controller device of a larger system containing memory device 1100-B, as but two examples.

Figure 11C:
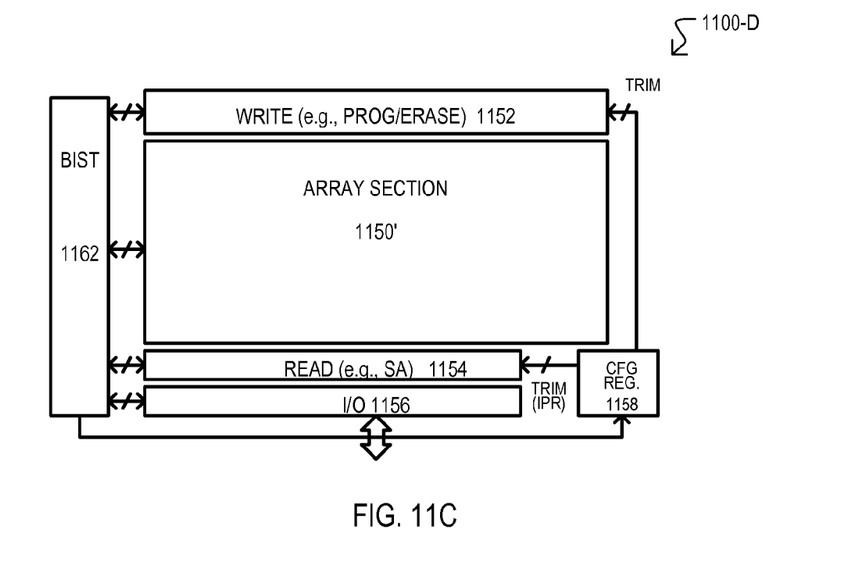

FIG. 11C shows a memory device 1100-C according to yet another embodiment. A memory device 1100-C can include sections like those of FIG. 11B. The embodiment of FIG. 11C differs from 11B in that TRIM values, including those that establish an IPR limit for read circuits 1154, can be provided by a built-in self-test (BIST) circuit 1162. A BIST circuit 1162 can perform self-test on various sections of memory device 1100-C. In one embodiment, a BIST circuit 1162 can apply program conditions to one or more memory elements within memory array section 1150 to arrive at an IPR value for a given threshold resistance value, as described herein, and equivalents. According to such an IPR value, TRIM values can be stored in configuration register 1158 that will limit a read current of read circuits 1154 based on such an IPR.

Embodiments above have shown memory devices, circuits and corresponding methods for limiting a read current to a program threshold voltage. Additional methods according to various embodiments will now be described with reference to a number flow diagrams.

Figure 12:
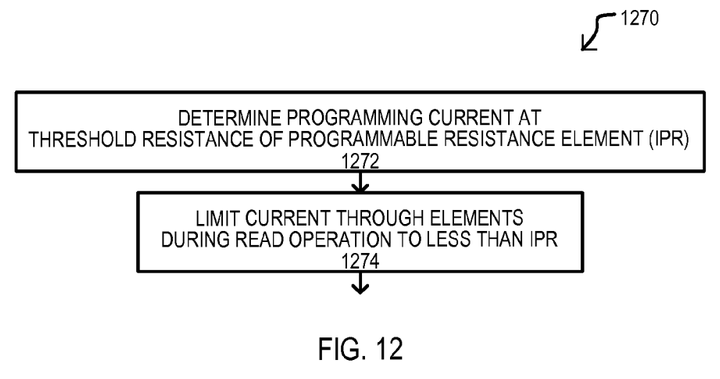
FIG. 12 is a flow diagram of a method according to one embodiment.

FIG. 12 shows a method 1270 according to one embodiment. A method 1270 can include determining a programming current at a threshold resistance of a programmable resistance element (IPR) 1272. In some embodiments, such an action can include establishing a threshold resistance, that is a resistance that delineates two different resistance states, or is otherwise at a level or range between two different resistance states. When an element is programmed between the two resistance states, a current flowing through the element can be determined. In some embodiments, such a determination can be made by measuring such a value on memory elements of same manufacturing lot, or memory elements made according to the same process, or memory elements of the same design. In other embodiments, such a determination can be made by measurements performed on a memory device itself. In still other embodiments, such a determination can be made with simulation results, based on models of the memory elements.

A method 1270 can further include limiting a current through elements during a read operation to less than IPR 1274. Such an action can include, ensuring a current flow through each element accessed in a read operation does not exceed IPR.

Figure 13:
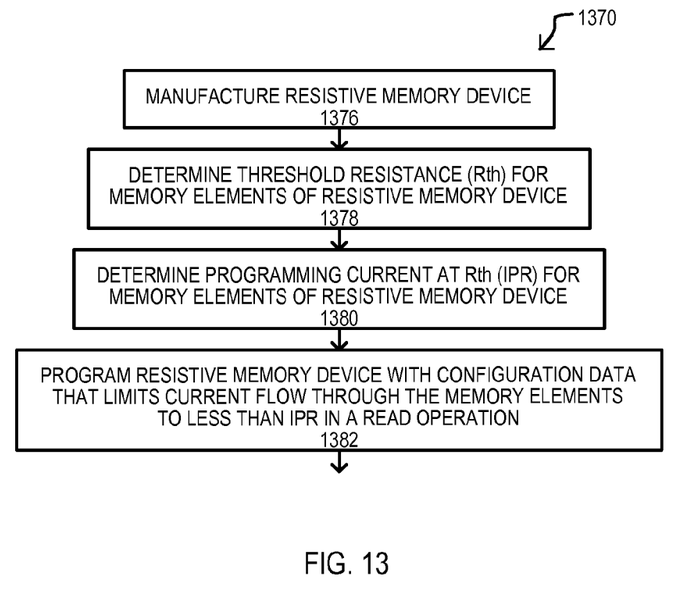
FIG. 13 is a flow diagram of a method according to another embodiment.

FIG. 13 shows a method 1370 according to another embodiment. A method 1370 can include manufacturing a resistive memory device 1376. In some embodiments, such an action can include fabricating a memory device having memory cells with one or more programmable resistance elements. Such a memory device can include a memory "embedded" in a larger system of integrated circuit device, or can include a "standalone" memory device.

A threshold resistance (Rth) can be determined for memory elements of the resistive memory device 1378. In some embodiments, such an action can include deriving an Rth value based on any of: memory element response (of the device itself, or devices of a same manufacturing lot), memory device type, or memory device application. Alternatively, such a value can be a value set by a manufacturer based on other factors.

A programming current at Rth (IPR) can be determined for memory elements of the resistive memory device 1380. Such an action can any of those noted for box 1272 of FIG. 12, or equivalent actions.

A resistive memory device can then be programmed with configuration data that limits a current flow through memory elements to less than IPR in a read operation 1382. Such an action can include storing, or otherwise setting, configuration data in a resistive memory device that limits a read current through memory elements. In some embodiments, such an action can include substantially permanent steps, such as metallization options (or other fabrication steps), or programming one-time programmable (OTP) circuit elements (e.g., fusible links, anti-fuse elements, programming OTP memory cells). In addition or alternatively, such an action can include re-programmable steps, such as writing configuration data to volatile and/or nonvolatile (but re-programmable) memory elements.

While embodiments above have shown limit a read current through a memory element based on a program threshold current (IPR), it is understood that an IPR value need not be static throughout the life of a memory device. Some memory elements can have resistance characteristics that can change over the life of a memory device. Accordingly, in some embodiments, an IPR limit value can be changed as memory element responses change. One particular embodiment that can adjust read limit current values is shown in FIG. 14.

Figure 14:
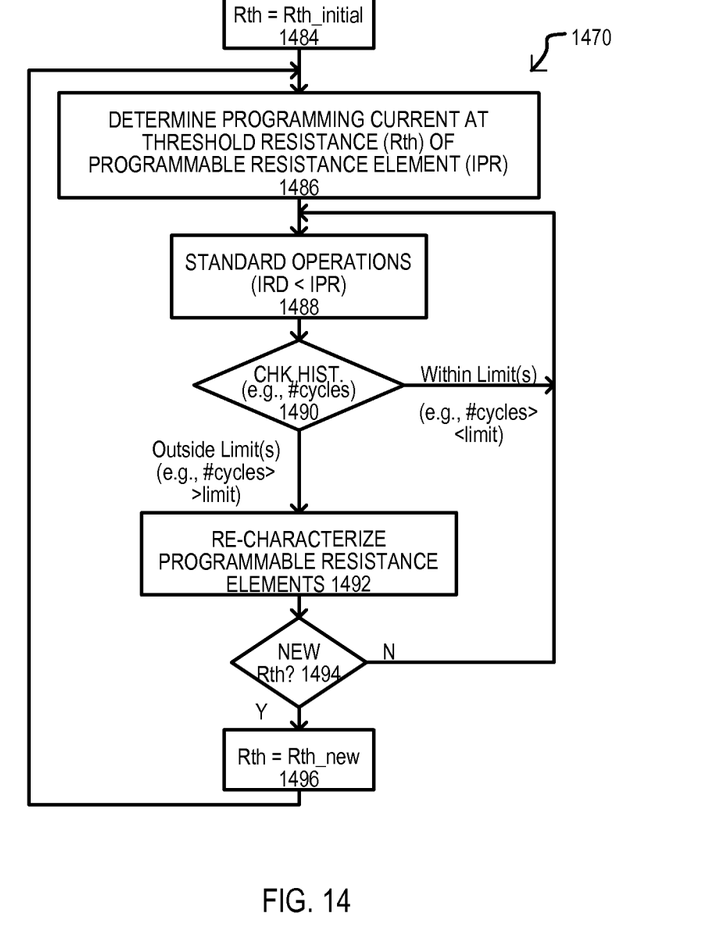
FIG. 14 is a flow diagram of a method that can re-adjust a read current limit according to an embodiment.

FIG. 14 shows a method 1470 according to an embodiment. A method 1470 can include arriving at an initial threshold resistance value (Rth=Rth_initial) 1484. In some embodiments, such an action can include any of those noted for box 1378 of FIG. 13, or equivalents. A method 1470 can determine an IPR value for a current Rth 1486. Such an action can include any of those noted for box 1272 of FIG. 12, or equivalents.

A method 1470 can include executing standard operations 1488. Such actions can include programming operations that can establish read data values based on programmed resistance states of programmable resistance elements. It is understood that a current Rth value can delineate, or otherwise be situated between such programmed resistance states. Further, in read operations, a read current through memory elements can be limited according to IPR. In the particular embodiment shown, a read current can be limited to less than IPR (IRD<IPR).

Periodically, a method 1470 can check a history of memory device operations 1490. In one embodiment, such an action can include comparing a number of memory device cycles to one or more limits. However, such an action can include other actions within a memory device, such as checking a device performance, error rate, age, time of inaction, etc.

If memory devices operations are within a check limit (Within Limit(s)), a method 1470 can return to standard operations 1488.

However, if memory devices operations are outside a check limit (Outside Limit(s)), a method 1470 can re-characterize programmable resistance memory elements. Such an action can include checking an element response to one or more program operations. Such a check can determine if a memory device may operate better with a different Rth value.

If a new Rth value is not generated (N from 1494), a method 1470 can return to standard operations 1488.

If a new Rth value is needed (Y from 1494), a method 1470 can set Rth to such a new value 1496. A method 1470 can then return to 1486 to arrive at a new IPR value based on the new Rth.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention can be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
read circuits coupled to a plurality of memory elements that are programmable between at least two different resistance states, the read circuits generating output values based on resistance states of selected memory elements in a read operation; and
current limit circuits that limit a current flow through each memory element to less than a program threshold current in the read operation, the current limit circuits being connected in series with the selected memory elements between the read circuits and a predetermined voltage; wherein
the program threshold current corresponds to a current that flows through a memory element being programmed to cause its resistance to change to a resistance between that of two different resistance states.

2. The memory device of claim 1, wherein:
the memory elements comprise a solid ion conductor material.

3. The memory device of claim 1, wherein:
the memory elements comprise a memory material formed between two electrodes, the memory material being selected from the group of: a chalcogenide and a metal oxide.

4. The memory device of claim 3, wherein:
the memory elements include
at least one of the electrodes comprising a metal selected from the group of: silver and copper, and
the chalcogenide includes germanium and sulfur.

5. The memory device of claim 1, further including:
a memory cell array that includes the memory elements coupled between conductive first lines and conductive second lines arranged at different directions than the first lines;
the read circuits are coupled to the second lines; and
the current limit circuits are coupled to the first lines.

6. The memory device of claim 1, further including:
a memory cell array that includes the memory elements coupled between conductive first lines and conductive second lines arranged at different directions than the first lines;
the read circuits are coupled to the second lines; and
the current limit circuits are coupled to the second lines.

7. The memory device of claim 1, further including:
a plurality of memory cells, each memory cell including an access device that provides a controllable current path between a bit line and a memory element; and
the current limit circuits are coupled to the bit lines.

8. The memory device of claim 1, further including:
a plurality of memory cells, each memory cell including an access device that provides a controllable current path between a bit line and a first terminal of a memory element, second terminals of the memory elements being connected to a common node; and
the current limit circuits are coupled between the common node and a bias node.

9. The memory device of claim 1, further including:
a plurality of memory cells, each memory cell including an access device that provides a controllable current path between a bit line and a memory element; and
the current limit circuits are coupled between each access device and the memory element of the memory cell.

10. The memory device of claim 9, wherein:
the current limit circuits comprise a conductive interconnection between access device and the memory element of the memory cell.

11. The memory device of claim 1, further including:
a plurality of memory cells, each memory cell including a current limit circuit that limits a current between a bit line and a memory element.

12. The memory device of claim 1, further including:
each current limit circuit includes a control terminal;
a plurality of word lines commonly coupled to the control terminals of current limits circuits of a same row; and word line driver circuits that apply electrical conditions to a selected word line that limit a current through the current limit circuits of the corresponding row to less than the programming threshold current.

13. The memory device of claim 1, further including:
the read circuits establish a first voltage across selected memory elements in a read operation; and
program circuits that establish a second voltage across selected memory elements in a program operation; wherein
the absolute value of the second voltage is greater than the absolute value of the first voltage.

14. The memory device of claim 1, wherein:
the current limit circuits are selected from the group of: resistors, programmable resistance circuits, transistors, and capacitors.

15. The memory device of claim 1, further including:
the current limit for the current limit circuits is established by current limit configuration data; and
a configuration data store that stores the current limit configuration data.

16. The memory device of claim 15, wherein:
the configuration data store comprises some of the memory elements.

17. The memory device of claim 1, wherein:
the program threshold current is a current determined to flow through an element being programmed to cause its resistance to change to a resistance between that of two different resistance states, less a guard band value.

18. The memory device of claim 1, wherein:
the program threshold current is a current determined to flow through an element being programmed to cause its resistance to change to a resistance between that of two different resistance states.

19. The memory device of claim 1, wherein:
the current limit circuits comprise a portion of the read circuits.

20. A method, comprising:
limiting a current flowing through selected memory elements in a read operation to less than a program threshold current with current limiting circuits connected in series with the selected memory elements between read circuits and a predetermined voltage; wherein
the memory elements are programmable between at least two different resistance states;
the program threshold current corresponds to a current that flows through a memory element being programmed to cause its resistance to change to a first resistance between that of two different resistance states, and
the read circuits determine a data value stored by the selected memory elements based on a resistance of the selected memory elements.

21. The method of claim 20, wherein:
the program threshold current corresponds to a current that flows through a memory element being programmed from a second resistance to a third resistance; wherein
the second resistance is greater than the first resistance, and the third resistance is less than the first resistance.

22. The method of claim 20, wherein:
the program threshold current corresponds to a current that flows through a memory element when being programmed from a second resistance to a third resistance; wherein
the second resistance is less than the first resistance, and the third resistance is greater than the first resistance.

23. The method of claim 20, wherein:
each memory element is coupled between a first conductive line and second conductive line; and
limiting the current flowing through selected memory elements with current limiting circuits disposed between a voltage source and a first conductive line coupled to the selected memory elements.

24. The method of claim 20, wherein:
each memory element is coupled between a first conductive line and second conductive line; and
limiting the current flowing through selected memory elements with current limiting circuits disposed between second conductive lines coupled to the selected memory elements and the read circuits.

25. The method of claim 20, further including:
each memory element is coupled between a first conductive line and second conductive line;
determining data values stored by the selected memory elements based on a resistance of the selected memory elements with sense circuits coupled to the second conductive lines; and
limiting the current flowing through selected memory elements with current limiting circuits disposed between the sense circuits and a power supply node.

26. The method of claim 20, wherein:
each memory element is coupled to a bit line by an access device, a control terminal of access devices of a same row being connected to a same word line; and
limiting the current flowing through selected memory elements with current limiting circuits coupled to the bit lines.

27. The method of claim 20, wherein:
each memory element is coupled to a bit line by an access device, a control terminal of access devices of a same row being connected to a same word line; and
limiting the current flowing through selected memory elements with the access devices corresponding to the selected memory elements.

28. The method of claim 20, wherein:
each memory element is coupled to a bit line by an access device; and
limiting the current flowing through selected memory elements by an interconnection between each access device and the memory element.

29. The method of claim 20, further including:
establishing the program threshold current by storing configuration data in a memory device containing the memory elements.

30. A method, comprising:
determining a program threshold current for resistive memory elements in a memory device; and
programming configuration data into the memory device that limits current flow through the resistive memory elements in a read operation to less than the program threshold current; wherein
the program threshold current corresponds to a current that flows through a memory element being programmed to cause its resistance to change to a first resistance between that of two different programmable resistances of the memory element.

31. The method of claim 30, wherein:
the resistive memory elements comprise a solid ion conductor material.

32. The method of claim 30, wherein:
the resistive memory elements are each two terminal memory elements.

33. The method of claim 30, wherein:
determining the program threshold current for resistive memory elements in a memory device includes applying program conditions to resistive memory elements of the memory device with testers selected from the group of: a wafer probe that probes the memory device in integrated die form as part of a wafer; a tester that applies test signals to memory devices in integrated circuit packages; a controller device formed in an electronic system containing the memory device; and built-in-self-test circuits formed as part of the memory device.

34. The method of claim 30, wherein:
determining the program threshold current for resistive memory elements in a memory device includes
sampling other memory devices, and
applying program conditions to resistive memory elements of said other memory devices to determine the program threshold current.

35. The method of claim 34, wherein:
the other memory devices are selected from the group of: memory devices from a same fabrication lot as the memory device, memory devices having the same resistive memory element type as the memory device.

36. The method of claim 30, further including:
after a predetermined number of operations of the memory device,
resetting the first resistance value based on electrical measurements of the resistive memory elements, and
determining the program threshold current based on the reset first resistance value.

\* \* \* \* \*